United States Patent
Jo et al.

(10) Patent No.: US 11,854,467 B2
(45) Date of Patent: Dec. 26, 2023

(54) GATE DRIVER INCLUDING DUMMY OUTPUT BUFFER AND DISPLAY DEVICE INCLUDING SAME

(71) Applicant: LG Display Co., Ltd., Seoul (KR)

(72) Inventors: Sunghak Jo, Paju-si (KR); Binn Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/529,053

(22) Filed: Nov. 17, 2021

(65) Prior Publication Data
US 2022/0208079 A1  Jun. 30, 2022

(30) Foreign Application Priority Data

Dec. 30, 2020  (KR) .................. 10-2020-0188227

(51) Int. Cl.
| | | |
|---|---|---|
| G11C 19/28 | (2006.01) | |
| G09G 3/32 | (2016.01) | |
| G09G 3/3258 | (2016.01) | |
| G09G 3/3266 | (2016.01) | |
| G09G 3/3275 | (2016.01) | |

(52) U.S. Cl.
CPC ............... *G09G 3/32* (2013.01); *G11C 19/28* (2013.01); *G09G 3/3258* (2013.01); *G09G 3/3266* (2013.01); *G09G 3/3275* (2013.01); *G09G 2230/00* (2013.01); *G09G 2300/04* (2013.01); *G09G 2300/0413* (2013.01); *G09G 2310/0205* (2013.01); *G09G 2310/0267* (2013.01); *G09G 2310/0286* (2013.01);
(Continued)

(58) Field of Classification Search
CPC ............. G09G 3/32; G09G 2310/0286; G09G 2310/0291; G09G 2310/08; G09G 3/3258; G09G 3/3266; G09G 3/3275; G09G 2300/04; G09G 2300/0413; G09G 2310/0205; G09G 2310/0267; G09G 2320/0295; G09G 2230/00; G11C 19/28
See application file for complete search history.

(56) References Cited

U.S. PATENT DOCUMENTS

| | | | | |
|---|---|---|---|---|
| 2006/0238482 A1* | 10/2006 | Jang | ................. | G09G 3/3677 345/100 |
| 2013/0033468 A1* | 2/2013 | Takahashi | ............ | G09G 3/20 345/204 |

(Continued)

FOREIGN PATENT DOCUMENTS

| | | | | |
|---|---|---|---|---|
| KR | 2006034059 A | * | 4/2006 | .......... G09G 3/3677 |
| KR | 10-2020-0041605 A | | 4/2020 | |

*Primary Examiner* — Adam J Snyder
(74) *Attorney, Agent, or Firm* — Birch, Stewart, Kolasch & Birch, LLP

(57) ABSTRACT

A gate driver and a display device including the gate driver are discussed. The gate driver in one example includes a shift register configured to control charging and discharging of a Q node and a QB node, and i output buffers sequentially connected to the shift register, where i is a natural number of at least 2. Each output buffer is configured to output a gate signal to a corresponding gate line in response to a voltage of the Q node and a voltage of the QB node. The gate driver further includes a dummy output buffer connected to the last stage of the shift register and configured to output a dummy signal to a dummy line in response to the voltage of the Q node.

18 Claims, 9 Drawing Sheets

(52) U.S. Cl.
CPC . *G09G 2310/0291* (2013.01); *G09G 2310/08* (2013.01); *G09G 2320/0295* (2013.01)

(56) References Cited

U.S. PATENT DOCUMENTS

| | | | |
|---|---|---|---|
| 2013/0100007 A1* | 4/2013 | Yamamoto | G09G 3/36 377/64 |
| 2013/0222357 A1* | 8/2013 | Tseng | G09G 3/3677 345/212 |
| 2015/0170592 A1* | 6/2015 | Bai | G09G 3/3677 345/100 |
| 2017/0004760 A1* | 1/2017 | Jang | G09G 3/3677 |
| 2019/0043405 A1* | 2/2019 | Noh | G09G 3/20 |
| 2019/0066599 A1* | 2/2019 | Kim | G09G 3/3266 |
| 2019/0164498 A1* | 5/2019 | Jang | G09G 3/3266 |
| 2019/0206294 A1* | 7/2019 | Tian | G09G 3/20 |
| 2020/0066203 A1* | 2/2020 | Kim | G09G 3/3266 |
| 2020/0118509 A1 | 4/2020 | Noh et al. | |
| 2020/0143728 A1* | 5/2020 | Lee | G09G 3/20 |

* cited by examiner

GATE DRIVER INCLUDING DUMMY OUTPUT BUFFER AND DISPLAY DEVICE INCLUDING SAME

CROSS REFERENCE TO RELATED APPLICATION

The present application claims priority to Korean Patent Application No. 10-2020-0188227, filed on Dec. 30, 2020 in the Republic of Korea on, the entire contents of which are hereby expressly incorporated by reference herein for all purposes into the present application.

BACKGROUND OF THE INVENTION

Field of the Invention

The present disclosure relates to a gate driver and a display device including the same.

Description of the Related Art

A display device includes a display panel including a plurality of pixels, a gate driver for driving the pixels, a data driver, and a timing controller. The gate driver is provided with stage circuits that are connected to gate lines, and the stage circuits apply gate signals to the gate lines that are connected thereto in response to control signals received from the timing controller.

SUMMARY OF THE INVENTION

In embodiments of the present disclosure, there is provided agate driver and a display device including the same, in which the gate driver is configured such that multiple output buffers are connected to one shift register so as to allow gate signals to be output to a plurality of gate lines.

In addition, in embodiments of the present disclosure, there is provided a gate driver and a display device including the same, in which the gate driver is provided with a dummy output buffer positioned at the last stage of each shift register so as to receive a clock signal or a dummy clock signal.

According to an embodiment of the present disclosure, a gate driver includes a plurality of stage circuits, wherein each of the plurality of the stage circuits can include a shift register configured to control charging and discharging of a Q node and a QB node; i (here, i is a natural number of at least 2) output buffers sequentially connected to the shift register and each configured to output a gate signal to a corresponding gate line in response to a voltage of the Q node and a voltage of the QB node; and a dummy output buffer connected to the last stage of the shift register and configured to output a dummy signal to a dummy line in response to the voltage of the Q node.

Each of the output buffers can receive any one clock signal among a plurality of clock signals and output the clock signal to the gate line in response to the voltage of the Q node, wherein the plurality of clock signals can have the same waveform, and can be square wave signals that have sequentially shifted in phase and have gate-on voltage periods overlapped.

The dummy output buffer can include a transistor configured to receive a dummy clock signal and output the dummy clock signal to the dummy line in response to the voltage of the Q node.

The dummy clock signal can have the same waveform with the plurality of clock signals, and can be a square wave signal that has shifted in phase with respect to the clock signal applied to the last output buffer among the plurality of output buffers.

A rising edge of the dummy clock signal can be disposed between a falling edge of the clock signal applied to an i−1th output buffer and a falling edge of the clock signal applied to an ith output buffer.

A falling edge of the dummy clock signal can be disposed before the voltage of the Q node is discharged.

The dummy output buffer can include a transistor configured to receive any one clock signal among the plurality of clock signals and output the clock signal to the dummy line in response to the voltage of the Q node.

The plurality of clock signals can have the same waveform and can include k (k is a natural number of at least 2) clock signals that are sequentially shifted in phase by 1/k periods, and a j−1th (j is a natural number of at least 2) clock signal can be applied to the last output buffer among the plurality of output buffers, and a jth clock signal can be applied to the dummy output buffer.

The number of the plurality of clock signals can have a relative prime relationship with the number of the output buffers that are connected to the shift register.

The dummy line can have a floated state.

According to an embodiment, a display device includes a display panel configured to display an image; a data driver configured to apply a data signal to the display panel; and a gate driver including a plurality of stage circuits and configured to apply a gate signal to the display signal, wherein each of the plurality of the stage circuits can include a shift register configured to control charging and discharging of a Q node and a QB node; i (here, i is a natural number of at least 2) output buffers sequentially connected to the shift register and each configured to output the gate signal to a corresponding gate line in response to a voltage of the Q node and a voltage of the QB node; and a dummy output buffer connected to the last stage of the shift register and configured to output a dummy signal to a dummy line in response to the voltage of the Q node.

According to embodiments of the present disclosure, the gate driver and the display device including the same enable an implementation of a display device that has a narrow bezel by reducing the area of the gate driver resulting from a reduction in the number of shift registers.

In addition, according to embodiments of the present disclosure, the gate driver and the display device including the same uniformly output the gate signals to the gate lines each connected to the output buffers, so that the image quality of the display panel can be prevented from deteriorating.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE EMBODIMENTS

Figure 1:
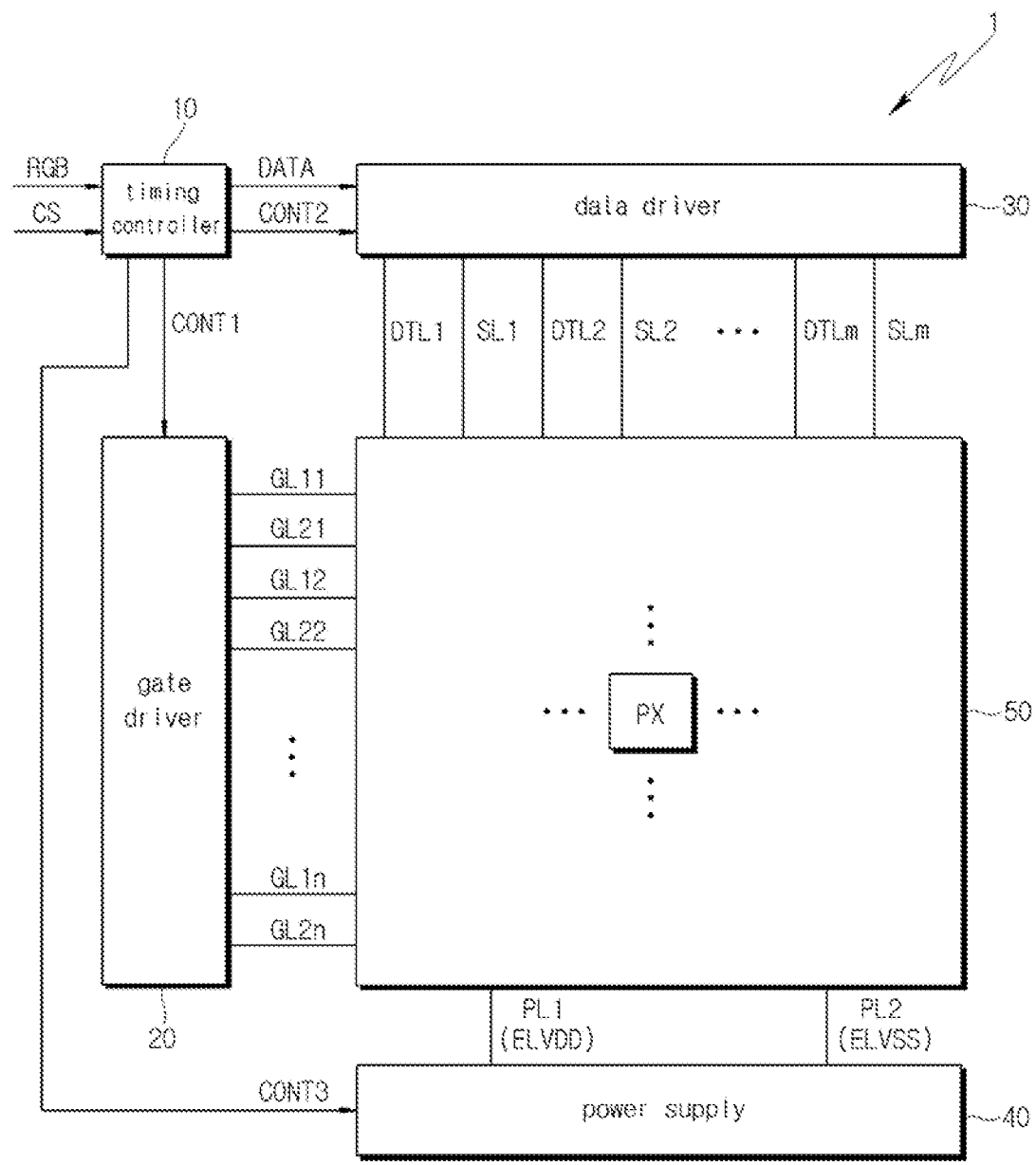
FIG. 1 is a block diagram illustrating a configuration of a display device according to an embodiment of the present disclosure.

Hereinafter, embodiments of the present disclosure will be described in detail with reference to the accompanying drawings. In this specification, it will be understood that when one component (or region, layer, portion) is referred to as being "on", "connected to", or "coupled to" another component, it can be directly disposed/connected/coupled on/to the one component, or an intervening third component can also be present.

Like reference numerals refer to like elements throughout. It will be understood that although the terms such as "first" and "second" are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form can include plural forms unless referred to the contrary.

The meaning of the term "include" or "comprise" specifies a property, a fixed number, a step, an operation, an element, a component or a combination thereof, but does not exclude other properties, fixed numbers, steps, operations, elements, components or combinations thereof.

All the components of each display device discussed herein according to all embodiments of the present disclosure are operatively coupled and configured.

FIG. 1 is a block diagram illustrating a configuration of a display device according to an embodiment of the present disclosure.

Referring to FIG. 1, a display device 1 includes a timing controller 10, a gate driver 20, a data driver 30, a power supply 40, and a display panel 50.

The timing controller 10 can receive an image signal RGB and a control signal CS from outside. The image signal RGB can include a plurality of gray scale data. The control signal CS can include, for example, a horizontal synchronization signal, a vertical synchronization signal, and a clock signal.

The timing controller 10 can process the image signal RGB and the control signal CS to make the signals appropriate for an operation condition of the display panel 50, so that the timing controller 10 can generate and output image data DATA, a gate driving control signal CONT1, a data driving control signal CONT2, and a power supply control signal CONT3.

The gate driver 20 can generate gate signals on the basis of the gate driving control signal CONT1 output from the timing controller 10. The gate driver 20 can provide the generated gate signals to the pixels PXs through multiple first gate lines GL11 to GL1*n*, where n can be a positive number such as a positive integer.

The gate driver 20 can provide a sensing signal to the pixels PXs through multiple second gate lines GL21 to GL2*n*. The sensing signal can be supplied so as to measure a characteristic of a driving transistor and/or a light-emitting element provided inside the pixels PXs.

The data driver 30 can generate data signals on the basis of the image data DATA and the data driving control signal CONT2 output from the timing controller 10. The data driver 30 can provide the generated data signals to the pixels PXs through multiple data lines DTL1 to DTLm.

The data driver 30 can provide a reference voltage (a sensing voltage, or an initialization voltage) to the pixels PXs through multiple sensing lines SL1 to SLm where m can be a positive number such as a positive integer, or can sense states of the pixels PXs on the basis of an electrical signal fed back from the pixels PXs.

The power supply 40 can generate a driving voltage to be provided to the display panel 50, on the basis of the power supply control signal CONT3. The driving voltage can include, for example, a high-potential driving voltage ELVDD and a low-potential driving voltage ELVSS. The power supply 40 can provide the generated driving voltages ELVDD and ELVSS to the pixels PXs, through corresponding power lines PL1 and PL2. In addition, the power supply 40 can supply a voltage required for driving the gate driver 20 and the data driver 30 and for generating a data voltage to the gate driver 20 and the data driver 30.

In the display panel 50, the multiple pixels PXs (or referred to as sub-pixels) are disposed. The pixels PXs can be, for example, arranged in a matrix form on the display panel 50. The pixels PXs can emit light with luminance corresponding to the gate signals and the data signals that are supplied through the first gate lines GL11 to GL1*n* and the data lines DTL1 to DTLm, respectively. In an embodiment, each pixel PX can display any one among red, green, blue, and white colors, but is not limited thereto.

The timing controller 10, the gate driver 20, the data driver 30, and the power supply 40 can be configured as separate integrated circuits (ICs), or ICs in which at least some thereof are integrated. For example, at least one among the data driver 30 and the power supply 40 can be configured as an integrated circuit integrated with the timing controller 10.

In addition, in FIG. 1, the gate driver 20 and the data driver 30 are illustrated as elements separated from the display panel 50, but at least one among the gate driver 20 and the data driver 30 can be configured in an in-panel manner that is formed integrally with the display panel 50. For example, the gate driver 20 can be formed in a bezel area of the display panel 50 according to a gate-in-panel (GIP) manner.

Figure 2:
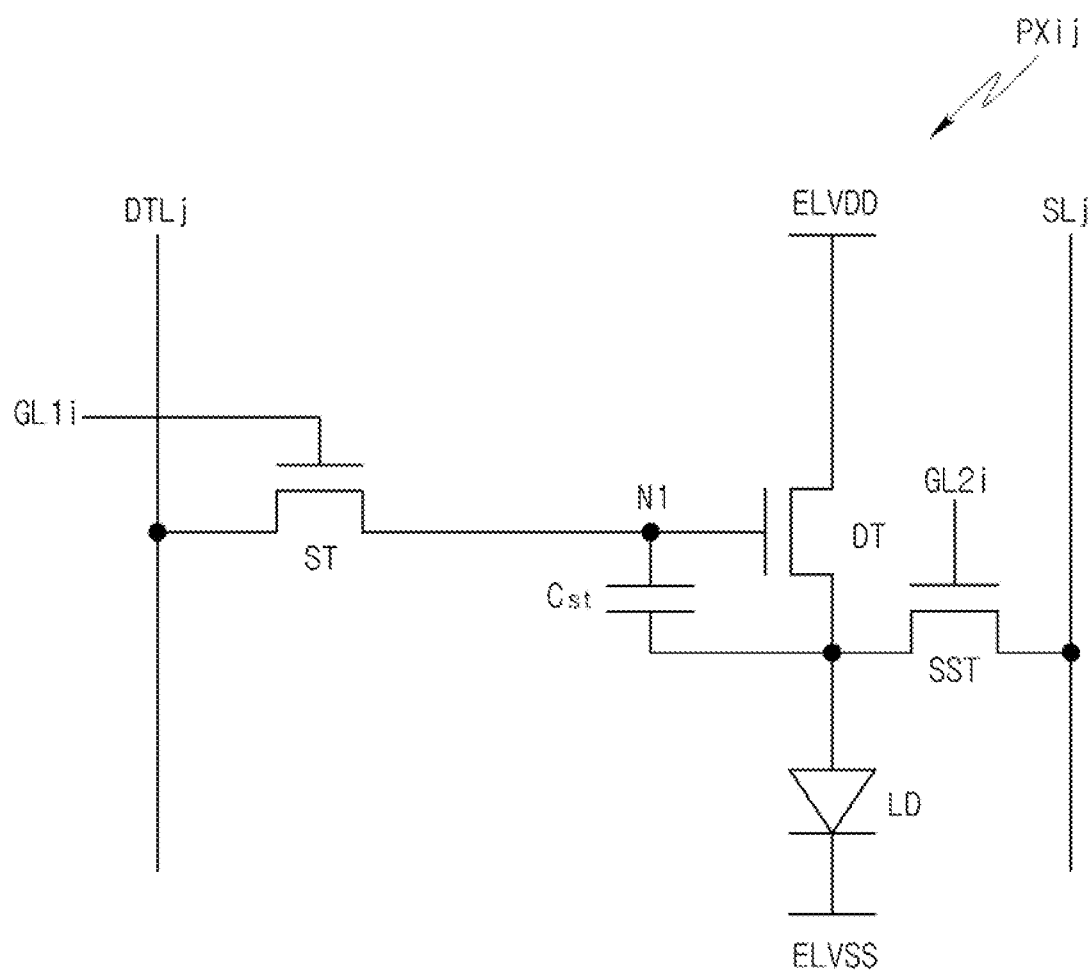
FIG. 2 is a circuit diagram illustrating an embodiment of a pixel illustrated in FIG. 1.

FIG. 2 is a circuit diagram illustrating an embodiment of a pixel illustrated in FIG. 1. FIG. 2 illustrates, as an example, a pixel PXij that is connected to an i-th first gate line GL1*i* and a j-th data line DTLj. Here, i and j can be a natural number.

Referring to FIG. 2, the pixel PX includes a switching transistor ST, a driving transistor DT, a sensing transistor SST, a storage capacitor Cst, and a light-emitting element LD.

A first electrode of the switching transistor ST is connected to the j-th data line DTLj and a second electrode of the switching transistor ST is connected to a first node N1. A gate electrode of the switching transistor ST is connected to the i-th first gate line GL1i. The switching transistor ST is turned on when a gate signal at a gate-on level is applied through the i-th first gate line GL1i, and transmits a data signal applied through the j-th data line DTLj, to the first node N1.

A first electrode of the storage capacitor Cst is connected to the first node N1, and a second electrode of the storage capacitor Cst can be configured to receive the high-potential driving voltage ELVDD. The storage capacitor Cst can be charged with a voltage corresponding to the difference between a voltage applied to the first node N1 and the high-potential driving voltage ELVDD.

A first electrode of the driving transistor DT is configured to receive the high-potential driving voltage ELVDD, and a second electrode of the driving transistor DT is connected to a first electrode (for example, an anode electrode) of the light-emitting element LD. A gate electrode of the driving transistor DT is connected to the first node N1. The driving transistor DT is turned on when a voltage at a gate-on level is applied through the first node N1, and can control the amount of a driving current flowing to the light-emitting element LD depending on a voltage provided to the gate electrode, for example, a voltage stored in the storage capacitor Cst.

A first electrode of the sensing transistor SST is connected to a j-th sensing line SLj, and a second electrode of the sensing transistor SST is connected to the first electrode of the light-emitting element LD. A gate electrode of the sensing transistor SST is connected to an i-th second gate line GL2i. The sensing transistor SST is turned on when a sensing signal at a gate-on level is applied through the i-th second gate line GL2i, and transmits a reference voltage applied through the j-th sensing line SLj, to the first electrode of the light-emitting element LD.

The light-emitting element LD outputs light corresponding to the driving current. The light-emitting element LD can be an organic light-emitting diode (OLED) or an ultra-small inorganic light-emitting diode having a size in a micro to nanoscale range, but the present disclosure is not limited thereto. Hereinafter, embodiments in which the light-emitting element LD is constructed as an organic light-emitting diode will be described.

In the present disclosure, the structure of the pixels PXs is not limited to that shown in FIG. 2. According to an embodiment, the pixels PXs can further include at least one element for compensating for a threshold voltage of the driving transistor DT, or initializing a voltage of the gate electrode of the driving transistor DT and/or a voltage of the anode electrode of the light-emitting element LD.

FIG. 2 illustrates an example in which the switching transistor ST, the driving transistor DT, and the sensing transistor SST are NMOS transistors, but the present disclosure is not limited thereto. For example, at least some or all of the transistors constituting each pixel PX can be constructed as PMOS transistors. In various embodiments, each of the switching transistor ST, the driving transistor DT, and the sensing transistor SST can be implemented as a low-temperature polycrystalline silicon (LTPS) thin-film transistor, an oxide thin-film transistor, or a low-temperature polycrystalline oxide (LTPO) thin-film transistor.

Figure 3:
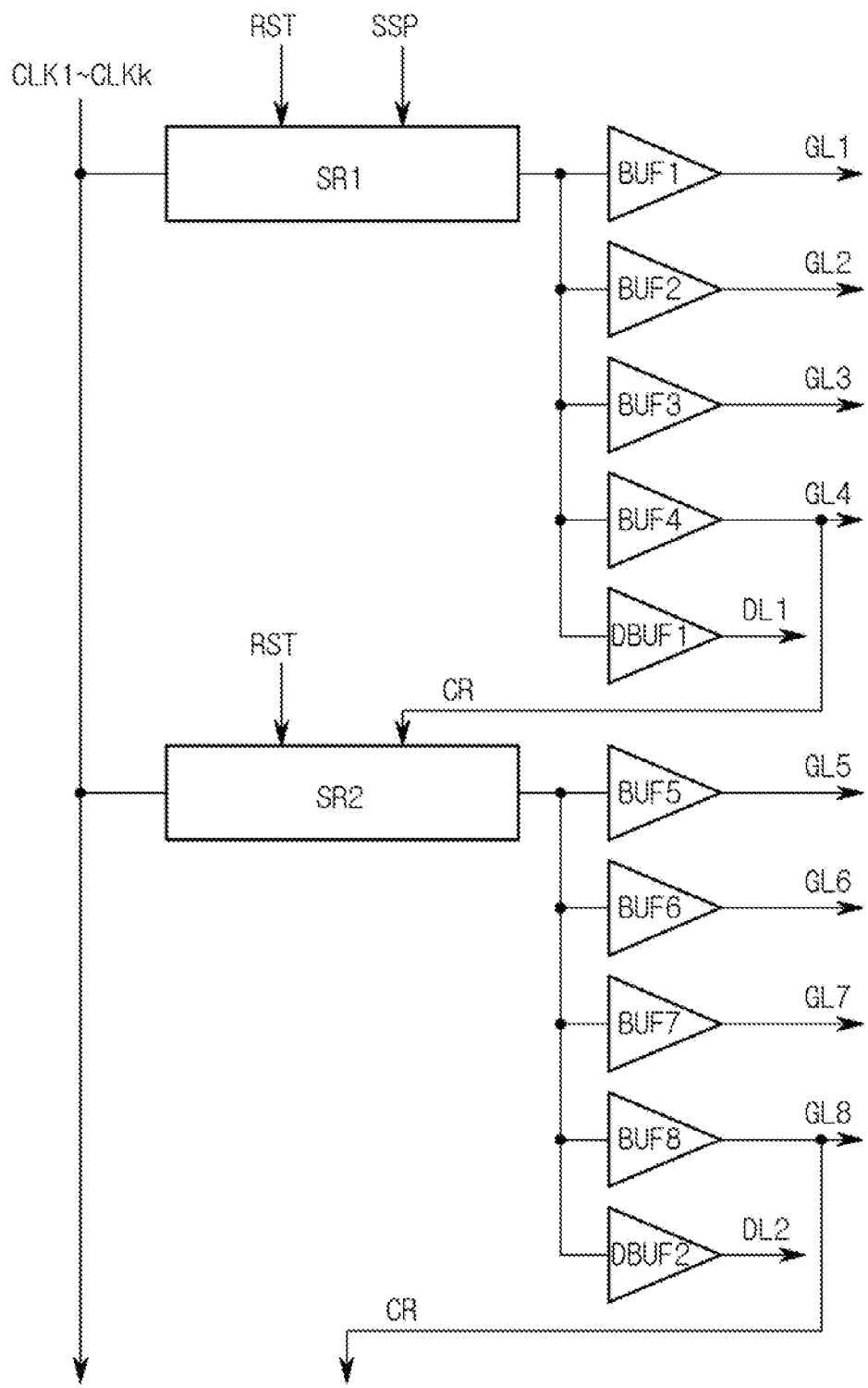
FIG. 3 is a view schematically illustrating a configuration of a gate driver according to an embodiment of the present disclosure.

FIG. 3 is a view schematically illustrating a configuration of a gate driver according to an embodiment of the present disclosure.

The gate driver 20 according to the embodiment of the present disclosure generates the gate signals on the basis of the gate driving control signal CONT1 applied from the timing controller 10, and the generated gate signals are sequentially applied to gate lines GL1 to GL8.

Referring to FIG. 3, the gate driver 20 can include a plurality of stage circuits. The stage circuits can receive at least one of clock signals CLK1 to CLKk. Each of the clock signals CLK1 to CLKk can be a square wave signal in which a gate-on voltage for turning-on transistors constituting the stage circuit and a gate-off voltage for turning-off the transistors constituting the stage circuit are repeated.

Each stage circuit includes shift registers SR1 and SR2 that are dependently connected through a carry signal line; and output buffers BUF1 to BUF4 and BUF5 to BUF 8 that are respectively and sequentially connected to the shift registers SR1 and SR2.

The shift registers SR1 and SR2 of each stage circuit can receive a scan start signal SSP or a carry signal CR that is output from a previous stage circuit. For example, a first shift register SR1 of a first stage circuit can receive the scan start signal SSP, and a second shift register SR2 of the remaining stage circuits can receive the carry signal CR output from the previous stage circuit. The shift resistors SR1 and SR2 can be charged with a node voltage of an output end thereof in response to the scan start signal SSP or the carry signal CR.

In an embodiment, the shift register SR1 and SR2 can further receive the carry signal CR output from the shift register of a next stage circuit. However, the embodiment is not limited thereto.

The shift registers SR1 and SR2 can further receive a reset signal RST. The shift registers SR1 and SR2 can discharge the node voltage of the output end thereof in response to the reset signal RST.

The output buffers BUF1 to BUF4 and BUF5 to BUF8 of each stage circuit can be sequentially connected to the output end of the shift registers SR1 and SR2. In the embodiment, the stage circuit can have a multi-output buffer structure in which multiple output buffers BUF1 to BUF8 are connected to one of the shift registers SR1 and SR2. For example, a first to a fourth output buffers BUF1 to BUF4 can be connected to the first shift register SR1, and a fifth to an eighth output buffers BUF5 to BUF8 can be connected to the second shift register SR2. Although it is illustrated in FIG. 3 that four output buffers BUF1 to BUF4 and BUF5 to BUF8 are connected to one of the shift registers SR1 and SR2 as an example, fewer or greater number of output buffers can be connected to one of the shift registers SR1 and SR2.

Generally, since the shift registers SR1 and SR2 are formed of multiple transistors, the gate driver 20 occupies a large area when the gate driver 20 is disposed on the display panel 50, so that the bezel area can be thickened.

In the embodiment, the stage circuit is configured such that one of the shift registers SR1 and SR2 outputs the gate signals to the plurality of gate lines GL1 to GL8. Therefore, the number of shift registers SR1 and SR2 within the gate driver 20 is reduced, and an area of the gate driver 20 is reduced, thereby enabling an implementation of a narrow bezel.

Each output buffer BUF1 to BUF4 and BUF5 to BUF8 can output the clock signals CLK1 to CLKk in response to the node voltage of the output end of the connected shift registers SR1 and SR2. As the gate signals, the output clock signals CLK1 to CLKk are applied to the gate lines GL1 to GL8.

When the pixels PXs connected to the gate driver 20 have the same structure as illustrated in FIG. 2, the gate signals can include a first gate signal and a second gate signal. However, the embodiment is not limited thereto.

The gate signals, as the carry signal CR, output from the last output buffers BUF4 and BUF8 of each stage circuit can be applied to the shift register of the next stage circuit through the carry signal line. Although it is illustrated in FIG. 3 that the shift registers SR1 and SR2 are directly connected to the shift register of the next stage circuit through the carry signal lines, the embodiment is not limited thereto. In another embodiment, the shift resistors SR1 and SR2 can be connected to any shift register which is disposed after a corresponding shift registers SR1 and SR2 through the carry signal lines.

In the embodiment, each stage circuit can further include dummy output buffers DBUF1 and DBUF2 that are connected to the shift registers SR1 and SR2, respectively. The dummy output buffers DBUF1 and DBUF2 can be connected to the last stage of the output buffers BUF1 to BUF4 and BUF5 to BUF8 of the corresponding shift registers SR1 and SR2.

The dummy output buffers DBUF1 and DBUF2 are provided for an equalization of the gate signals output from the output buffers BUF1 to BUF4 and BUF5 to BUF8 of the corresponding stage circuit. The dummy output buffers DBUF1 and DBUF2 can output output buffer signals to dummy lines DL1 and DL2 in response to the node voltage of the output end of the connected shift registers SR1 and SR2. Unlike the gate signals output from the output buffers BUF1 to BUF4 and BUF5 to BUF8, the output buffer signals output from the dummy output buffers DBUF1 and DBUF2 are not applied to the display panel 50 and do not affect an image displayed on the display panel 50.

In the present disclosure, the number of output buffers and the number of dummy output buffers along with any other number of elements discussed herein can vary and are not limited to those shown in the figures.

Hereinafter, the multi-output buffer structure of each stage circuit will be described in more detail.

Figure 4:
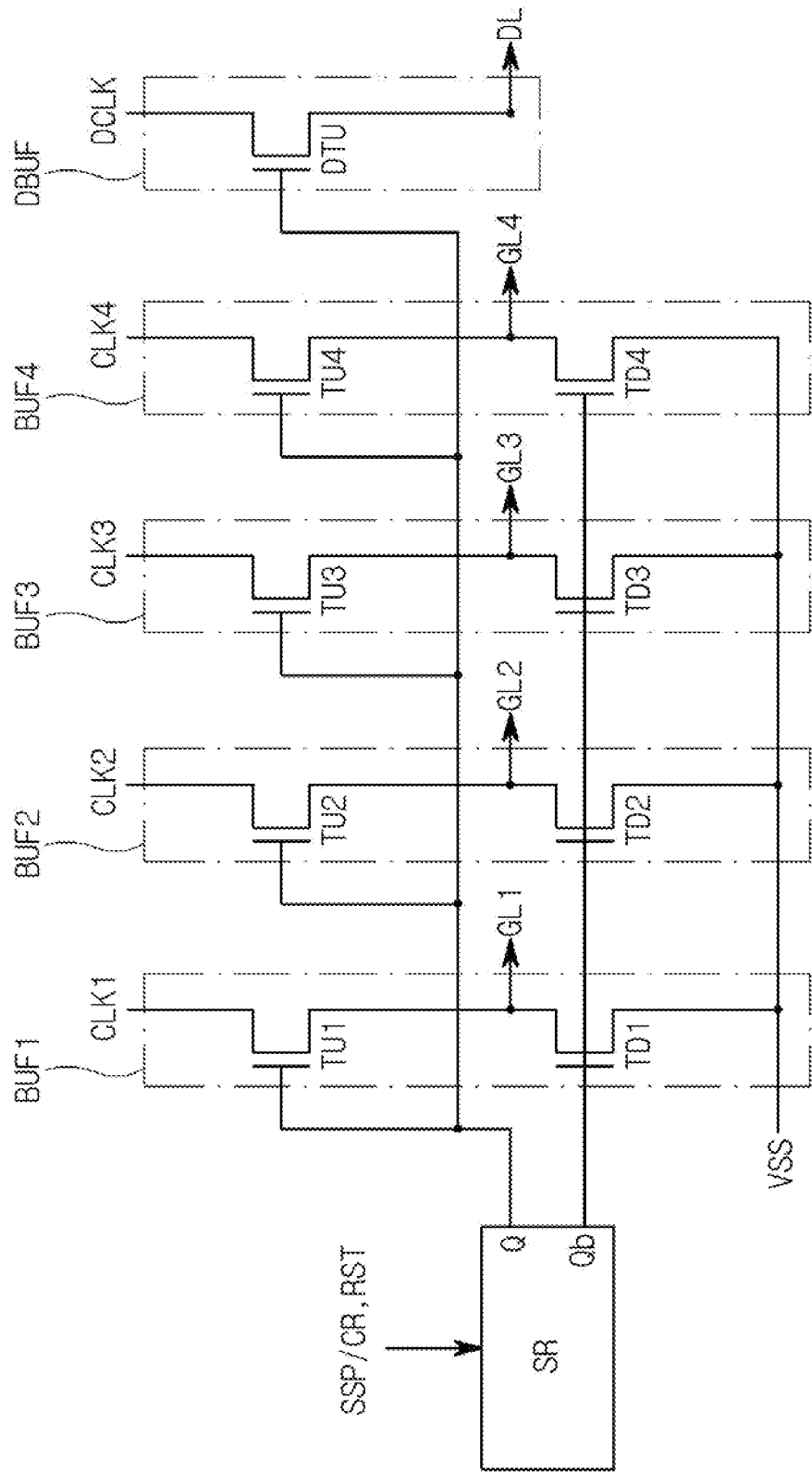
FIG. 4 is a circuit diagram illustrating a structure of a multi-output buffer according to an embodiment of the present disclosure.
Figure 5:
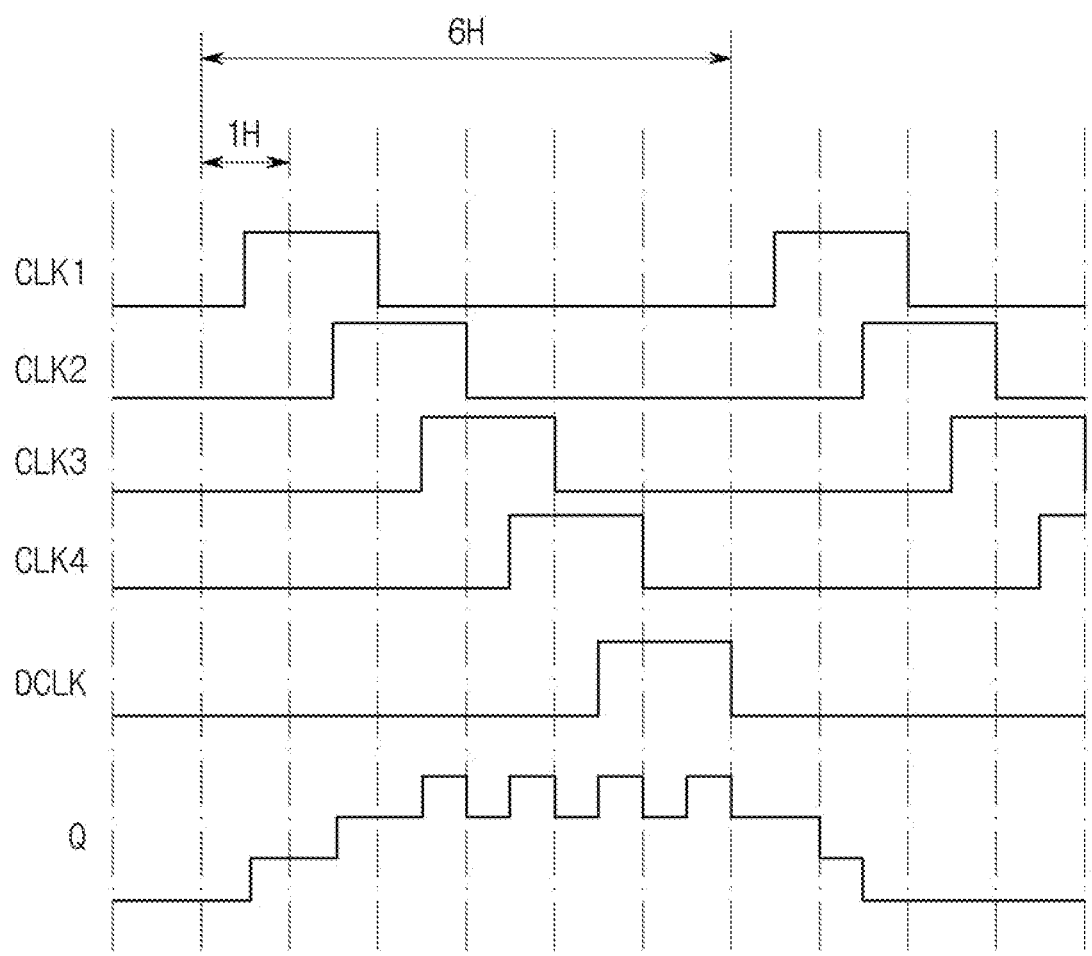
FIG. 5 is a timing diagram illustrating both clock signals applied to the multi-output buffer illustrated in FIG. 4 and a change in a Q node voltage of a shift register.
Figure 6:
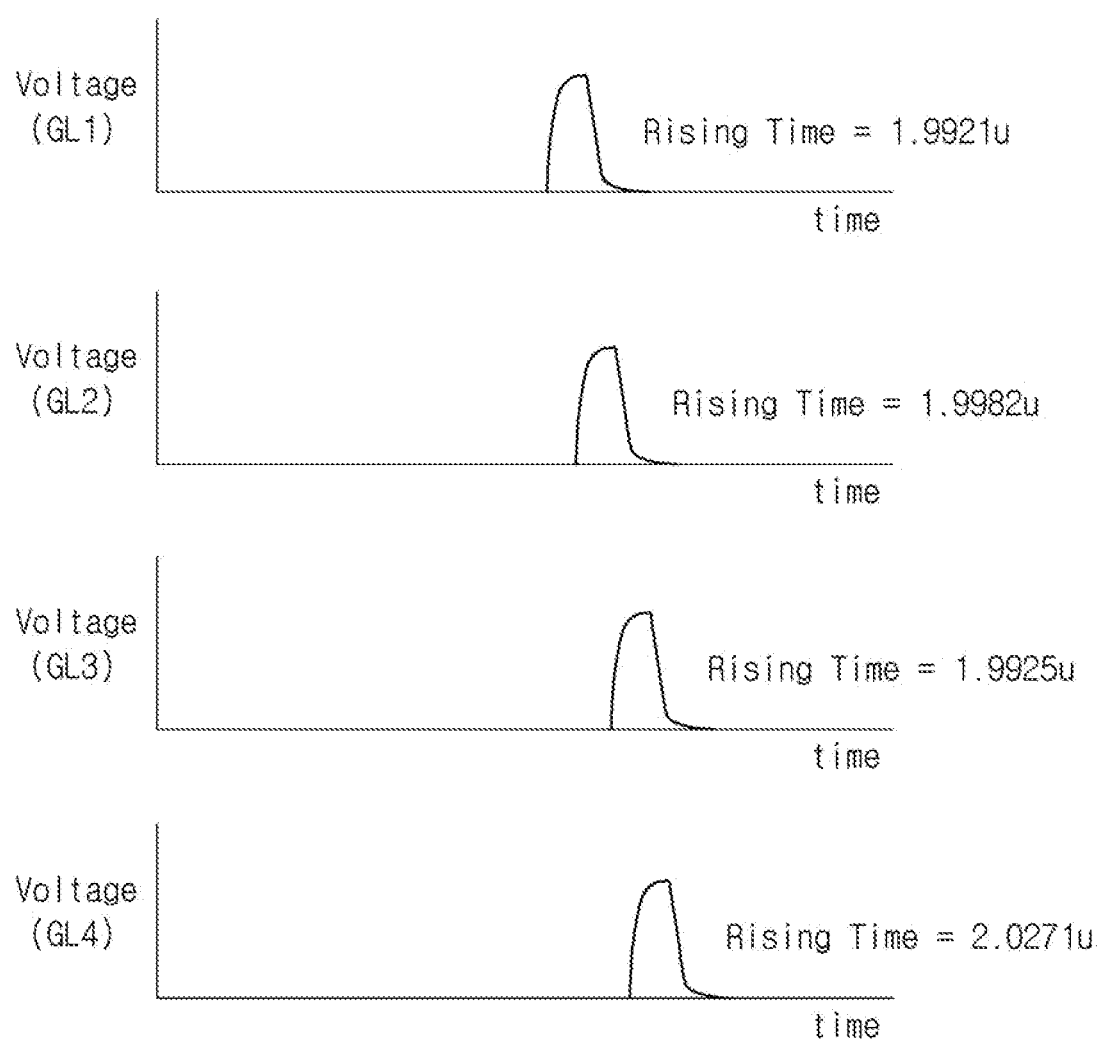
FIG. 6 is a view illustrating a delay of a gate signal output from the last output buffer of the shift register when a dummy output buffer is not provided.
Figure 7:
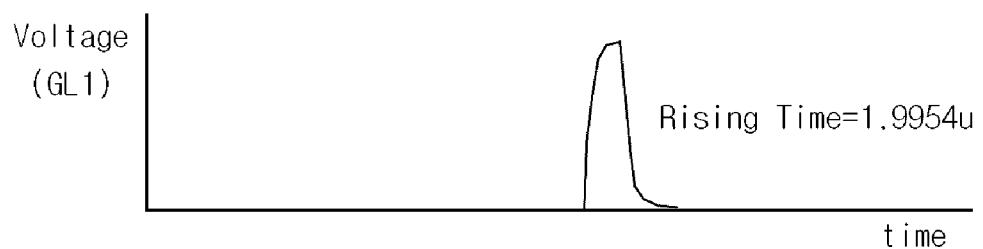
FIG. 7 is a view illustrating whether the gate signal output from the last output buffer of the shift register is delayed when the dummy output buffer is provided.
Figure 7:
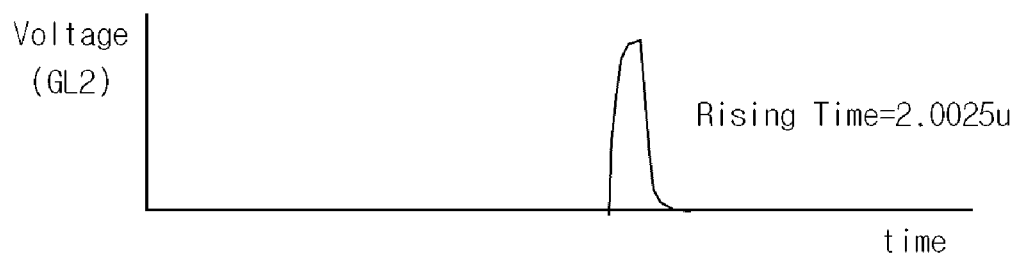
Figure 7:
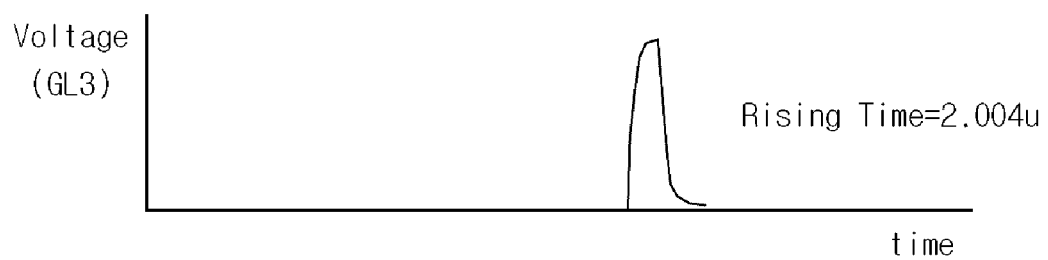
Figure 7:
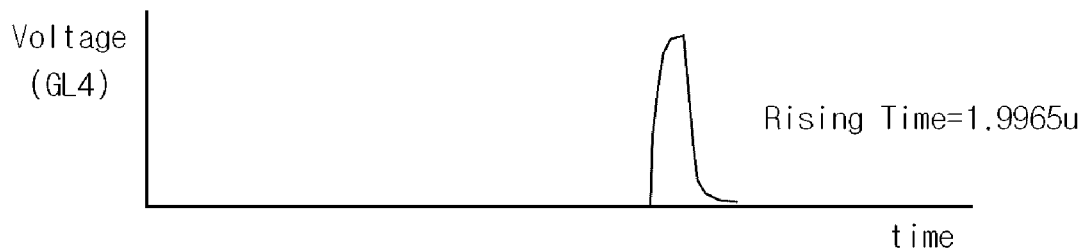

FIG. 4 is a circuit diagram illustrating a structure of the multi-output buffer according to an embodiment of the present disclosure. FIG. 5 is a timing diagram illustrating both the clock signals applied to the multi-output buffer illustrated in FIG. 4 and a change in a Q node voltage of the shift register. FIG. 6 is a view illustrating a delay of the gate signal output from the last output buffer of the shift register when the dummy output buffer is not provided. FIG. 7 is a view illustrating whether the gate signal output from the last output buffer of the shift register is delayed when the dummy output buffer is provided.

Referring to FIG. 4, the stage circuit includes the shift register SR and multiple output buffers BUF1 to BUF4 connected to the shift register SR.

The shift resistor SR can charge and discharge a voltage of a Q node and a QB node in response to the signals (scan start signal SSP or carry signal CR, reset signal RST) that are input. For example, the shift registers SR1 and SR2 can charge a Q node in response to the scan start signal SSP or the carry signal CR, and can discharge the Q node in response to the reset signal RST. When a voltage of the Q node is charged, a voltage of a QB node can be discharged. When the voltage of the Q node is discharged, the voltage of the QB node can be discharged.

The output buffers BUF1 to BUF4 can receive any one of k clock signals CLK1 to CLKk, where k can be a positive number. Referring to FIG. 5, each of the clock signals CLK1 to CLKk can be a square wave signal in which a gate-on voltage for turning-on transistors that are included in the output buffers BUF1 to BUF4 and a gate-off voltage for turning-off the transistors that are included in the output buffers BUF1 to BUF4 are repeated. In an embodiment, a gate-on voltage period can be set to be shorter than a gate-off voltage period in one period of the clock signals CLK1 to CLKk. For example, the gate-on voltage of the clock signals CLK1 to CLKk can have six horizontal periods 6H, and can be set to be shorter than the gate-off voltage period. For example, the gate-on voltage period can have a period between one horizontal period 1H and two horizontal periods. However, the present disclosure is not limited thereto.

In an embodiment, the clock signals CLK1 to CLKk can be signals having the same waveform and sequentially shifted in phase. For example, the clock signals CLK1 to CLKk can be signals of which phases are shifted by 1/k periods. As an example, the second clock signal CLK2 can be a signal having the same waveform as the first clock signal CLK1 and shifted in phase by 1/k periods. Further, the third clock signal CLK3 can be a signal having the same waveform as the second clock signal CLK2 and shifted in phase by 1/k periods.

In an embodiment, any of clock signals can overlap the gate-on voltage period of the next clock signal. For example, at least a portion of the gate-on voltage period of the first clock signal CLK1 and the gate-on voltage period of the second clock signal CLK2 can overlap each other. Further, at least a portion of the gate-on voltage period of the second clock signal CLK2 and the gate-on voltage period of the third clock signal CLK3 can overlap each other. The overlap periods of the clock signals CLK1 to CLKk can be about 0.5 horizontal periods, but are not limited thereto.

In an embodiment, the phases of the clock signals CLK1 to CLKk input to the output buffers BUF1 to BUF4 that are connected in sequence can have a difference equal to 1/k. For example, when the first clock signal CLK1 is applied to the first output buffer BUF1, the second clock signal CLK2 having a 1/k phase difference from the first clock signal CLK1 can be applied to the second output buffer BUF2. Here, k can be any integer. In FIG. 4 to 7, embodiments in which k is 4 are described as an example.

Each output buffer BUF1 to BUF4 respectively includes pull-up transistors TU1 to TU4 having a gate electrode thereof connected to the Q node, and the pull-up transistors TU1 to TU4 turned-on in response to the Q node voltage and configured to output the clock signals CLK1 to CLK4 to the gate lines GL1 to GL4; and pull-down transistors TD1 to TD4 having a gate electrode thereof connected to the QB node, and the pull-down transistors TD1 to TD4 turned-on in response to the QB node voltage and configured to output a low-potential power source at a gate-off level to the gate lines GL1 to GL4.

As described above, the output buffers BUF1 to BUF4 can output the gate signals to the connected gate lines GL1 to GL4 in response to the voltage of the Q node and the clock signals CLK1 to CLK4.

When the clock signals CLK1 to CLK4, for example, pulse signals are applied to the output buffers BUF1 to BUF4 that are connected to the output end of the shift register SR, the voltage of the Q node can be distorted.

Specifically, after the Q node is charged, the first output buffer BUF1 connected to the shift register SR can output the gate signal in response to the voltage of the Q node. Referring to FIG. 5, while the gate signal is output, the second clock signal CLK2 that is applied to the second output buffer BUF2 can rise. Then, the voltage of the Q node can be increased due to electrical coupling. Likewise, while the second output buffer BUF2 outputs the gate signal, the third clock signal CLK3 that is applied to the third output buffer BUF3 can rise, so that the voltage of the Q node can be increased.

This change in the Q node voltage changes a gate-source voltage Vgs of the pull-up transistors TU1 to TU4, so that the gate signals output to the gate lines GL1 to GL4 are changed. When the gate-source voltages Vgs of all the pull-up transistors TU1~TU4 are uniformly changed, the gate signals are output in a uniform form, so that nonuniformity of the image quality does not occur on the display panel 50. However, in case of the fourth output buffer BUF4 connected to the last stage of the shift register SR, there is no clock signal subsequently applied. Therefore, the Q node voltage does not increase while the gate signal is output, and the gate signal is output at a relatively low Q node voltage. As a result, the fourth output buffer BUF4 can output the gate signal in a different form from the first to third output buffers BUF1 to BUF3 connected to the previous stage.

Referring to FIG. 6, due to the change in the Q node voltage as described above, the gate signal of the fourth output buffer BUF4 connected to the last stage of the shift register SR is displayed in a delayed form than the gate signals of the previous output buffers BUF1 to BUF3.

In order to prevent the above-described limitation, the stage circuit according to the embodiment includes the dummy output buffer DBUF that is connected to the shift register SR.

The dummy output buffer DBUF is connected to the last stage of the corresponding shift resistor SR. In an embodiment in FIG. 4, the dummy output buffer DBUF can receive a dummy clock signal DCLK that is applied separately from the clock signals CLK1 to CLK4.

While the gate signal is output from the fourth output buffer BUF4, the dummy clock signal DCLK is applied to the dummy output buffer DBUF so as to maintain a high Q node voltage. Therefore, a rising edge of the dummy clock signal DCLK can be disposed after a falling edge of the third clock signal CLK3, and can be disposed before the falling edge of the fourth clock signal CLK4. In addition, the falling edge of the dummy clock signal DCLK is not specifically limited, but can be disposed before applying the reset signal RST, for example, before discharging of the Q node voltage.

In an embodiment, the dummy clock signal DCLK can be a signal having the same waveform as the clock signals CLK1 to CLK4 that are applied to the output buffers BUF1 to BUF4, as illustrated in FIG. 5, and shifted in phase. For example, the dummy clock signal DCLK can be a signal of which the phase is shifted by ¼ with respect to the fourth clock signal CLK4 that is applied to the output buffer BUF4 connected to the previous stage of the dummy output buffer DBUF. At this time, a gate-on voltage period of the dummy clock signal DCLK can overlap a gate-on voltage period of the fourth clock signal CLK4 that is applied to the output buffer BUF4 connected to the previous stage.

When the dummy clock signal DCLK that is applied to the dummy output buffer DBUF is rising, the Q node voltage increases. Then, as illustrated in FIG. 7, the gate signal output from the fourth output buffer BUF4 is not delayed, and can have the same form as the gate signal output from the first to the third output buffers BUF1 to BUF3.

The dummy output buffer DBUF can include a transistor DTU that is turned on according to the Q node voltage and outputs the dummy clock signal DCLK to the dummy line DL. In an embodiment, the dummy line DL can be floated. Accordingly, the dummy signal output to the dummy line DL through the transistor DTU can be distorted or delayed depending on the voltage change of the Q node that is described above. However, since the dummy signal is not applied to the display panel 50, a distortion of the dummy signal does not affect the image quality of the display panel 50.

As described above, in the embodiment, by using the dummy output buffer DBUF, nonuniformity between the multiple gate signals output from the stage circuit can be reduced and the deterioration of the image quality can be prevented.

Figure 8:
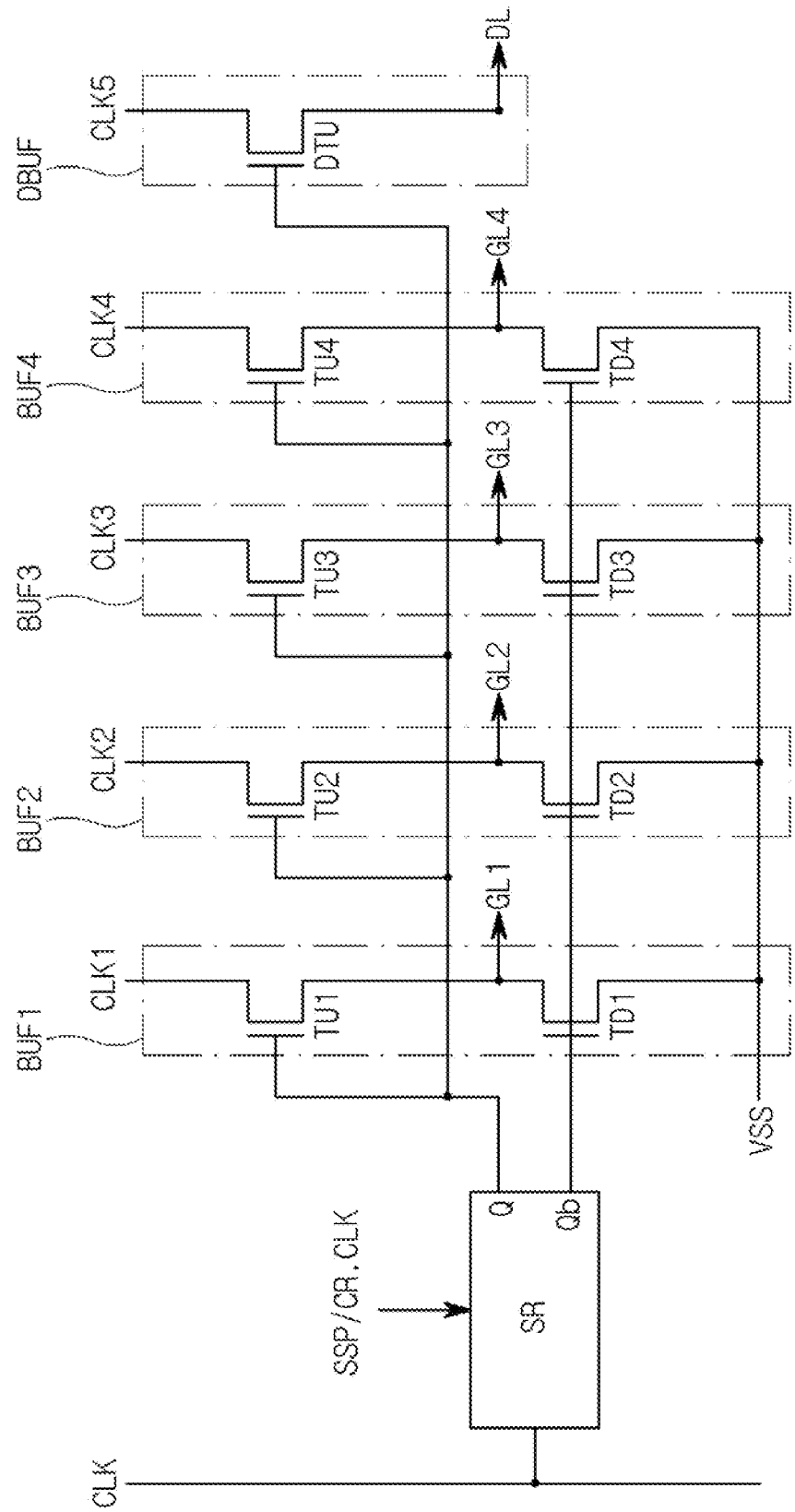
FIG. 8 is a circuit diagram illustrating a structure of the multi-output buffer according to another embodiment of the present disclosure.
Figure 9:
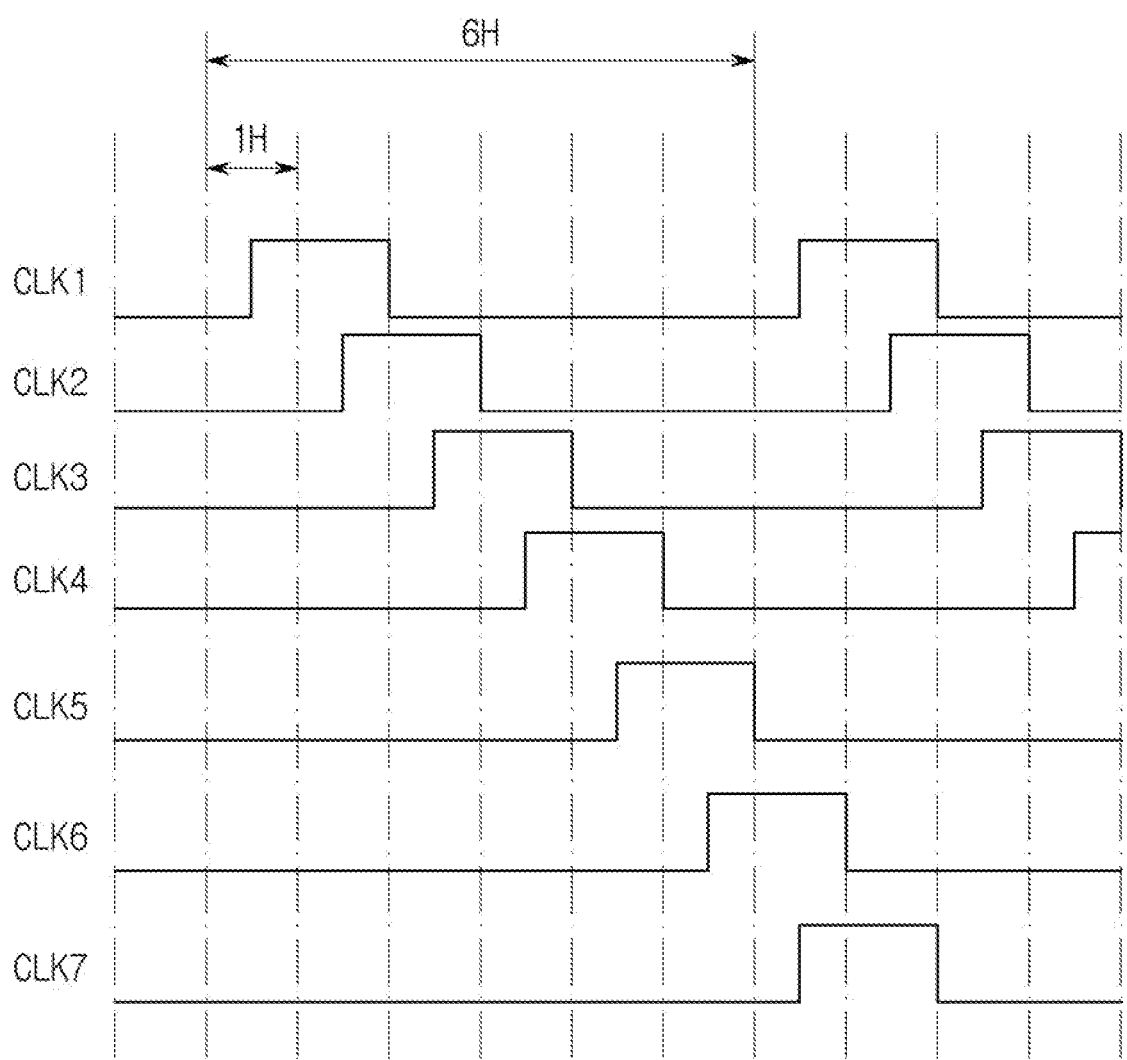
FIG. 9 is a timing diagram illustrating both the clock signals applied to the multi-output buffer and a change in the Q node voltage of the shift register according to another embodiment of the present disclosure.

FIG. 8 is a circuit diagram illustrating a structure of a multi-output buffer according to another embodiment of the present disclosure. FIG. 9 is a timing diagram illustrating both the clock signals applied to the multi-output buffer and a change in the Q node voltage of the shift register according to another embodiment of the present disclosure.

In an embodiment in FIGS. 4 and 5, the dummy output buffer DBUF receives the dummy clock signal DCLK that is separately provided. However, in an embodiment in FIGS. 8 and 9, the dummy output buffer DBUF receives one of the clock signals CLK1 to CLK7 that is applied to the output buffers BUF1 to BUF4.

In this embodiment, the number of the clock signals CLK1 to CLK7 can has a relative prime relationship with the number of the output buffers BUF1 to BUF4 that are connected to the shift register SR In an embodiment illustrated in drawings, four output buffers BUF1 to BUF4 are connected to the shift register SR, and seven clock signals CLK1 to CLK7 are provided.

The output buffers BUF1 to BUF4 can receive any one of the first to the seventh clock signals CLK1 to CLK7. In an embodiment, the phase of each of the clock signals CLK1 to CLK7 input to the output buffers BUF1 to BUF4 that are connected in sequence can have a difference equal to ⅐ with each other. The dummy clock signal DBUF can receive the fifth clock signal CLK5 of which the phase is shifted by ¼ with respect to the fourth clock signal CLK4 that is applied to the fourth output buffer BUF4 connected to the previous stage of the dummy output buffer DBUF.

In an embodiment, a part of the clock signals CLK1 to CLK7 can be applied to the dummy output buffer DBUF of the stage circuits, and the other part of the clock signals CLK1 to CLK7 may not be applied to the dummy output buffer DBUF of the stage circuits. In this embodiment, the clock signals connected to the dummy output buffer DBUF can be more increased in a load and can have an output deviation with other clock signals that is not connected to the dummy output buffer DBUF. The output deviation between clock signals can cause a horizontal dim phenomenon on the display panel 50.

As in the embodiment, when the number of the clock signals CLK1 to CLK7 has a relative prime relationship with the number of the output buffers BUF1 to BUF4 connected to the shift resistor SR, all clock signals CLK1 to CLK7 can be applied once to the dummy output buffer DBUF of the stage circuits. Accordingly, no output deviation occurs between the clock signals CLK1 to CLK7, and the deterioration of the image quality of the display panel 50 can be prevented.

It will be understood by those skilled in the art that the present disclosure can be embodied in other specific forms without changing the technical idea or essential characteristics of the present disclosure. Therefore, it should be understood that the embodiments described above are illustrative in all aspects and not restrictive. The scope of the present disclosure is characterized by the appended claims rather than the detailed description described above, and it should be construed that all alterations or modifications derived from the meaning and scope of the appended claims and the equivalents thereof fall within the scope of the present disclosure.

What is claimed is:

1. A gate driver comprising:
    a plurality of stage circuits,
    wherein each of the plurality of stage circuits comprises:
        a shift register configured to control charging and discharging of a Q node and a QB node;
        i output buffers sequentially connected to the shift register, each of the output buffers configured to output a gate signal to a corresponding gate line in response to a voltage of the Q node and a voltage of the QB node, where i is a natural number of at least 2; and
        a dummy output buffer connected to a last output buffer among the output buffers, and configured to output a dummy signal to a dummy line in response to the voltage of the Q node,
    wherein the dummy line has a floated state,
    wherein, in each of the plurality of stage circuits, the shift register is directly connected to inputs of the i output buffers and an input of the dummy output buffer,
    wherein each of the output buffers includes a pull-up transistor and a pull-down transistor, and
    wherein the dummy output buffer only includes one transistor, and the one transistor is configured to turn on based on the voltage of the Q node.

2. The gate driver of claim 1, wherein each of the output buffers is configured to receive any one clock signal among a plurality of clock signals, and output the received clock signal to the gate line in response to the voltage of the Q node, and
    wherein the plurality of clock signals have a same waveform, and are square wave signals that have sequentially shifted in phase and have gate-on voltage periods that are overlapped.

3. The gate driver of claim 2, wherein the dummy output buffer comprises a transistor configured to receive a dummy clock signal and output the dummy clock signal to the dummy line in response to the voltage of the Q node.

4. The gate driver of claim 3, wherein the dummy clock signal has the same waveform with the plurality of clock signals, and is a square wave signal that has shifted in phase with respect to the clock signal applied to the last output buffer among the plurality of output buffers.

5. The gate driver of claim 3, wherein a rising edge of the dummy clock signal is disposed between a falling edge of the clock signal applied to an (i−1)th output buffer and a falling edge of the clock signal applied to the last output buffer.

6. The gate driver of claim 3, wherein a falling edge of the dummy clock signal is disposed before the voltage of the Q node is discharged.

7. The gate driver of claim 2, wherein the dummy output buffer comprises a transistor configured to receive any one clock signal among the plurality of clock signals and output the clock signal to the dummy line in response to the voltage of the Q node.

8. The gate driver of claim 7, wherein the plurality of clock signals have the same waveform and include k clock signals that are sequentially shifted in phase by 1/k periods, where k is a natural number of at least 2, and
    a (j−1)th clock signal is applied to a last output buffer among the plurality of output buffers, and a jth clock signal is applied to the dummy output buffer, where j is a natural number of at least 2.

9. The gate driver of claim 7, wherein the number of the plurality of clock signals has a relative prime relationship with the number of the output buffers that are connected to the shift register.

10. A display device comprising:
    a display panel configured to display an image;
    a data driver configured to apply a data signal to the display panel; and
    a gate driver comprising a plurality of stage circuits and configured to apply a gate signal to the display panel,
    wherein each of the plurality of stage circuits comprises:
        a shift register configured to control charging and discharging of a Q node and a QB node;
        i output buffers sequentially connected to the shift register, where i is a natural number of at least 2, each of the output buffers configured to output the gate signal to a corresponding gate line in response to a voltage of the Q node and a voltage of the QB node; and
        a dummy output buffer connected to a last output buffer among the output buffers and configured to output a dummy signal to a dummy line in response to the voltage of the Q node,
    wherein the dummy line has a floated state,
    wherein, in each of the plurality of stage circuits, the shift register is directly connected to inputs of the i output buffers and an input of the dummy output buffer,
    wherein each of the output buffers includes a pull-up transistor and a pull-down transistor, and
    wherein the dummy output buffer only includes one transistor, and the one transistor is configured to turn on based on the voltage of the Q node.

11. The display device of claim 10, wherein each of the output buffers is configured to receive any one clock signal among a plurality of clock signals and output the clock signal to the gate line in response to the voltage of the Q node, and
    wherein the plurality of clock signals have a same waveform, and are square wave signals that have sequentially shifted in phase and have gate-on voltage periods overlapped.

12. The display device of claim 11, wherein the dummy output buffer comprises a transistor configured to receive a dummy clock signal and output the dummy clock signal to the dummy line in response to the voltage of the Q node.

13. The display device of claim 12, wherein the dummy clock signal has the same waveform with the plurality of clock signals, and is a square wave signal that has shifted in phase with respect to the clock signal applied to the last output buffer among the plurality of output buffers.

14. The display device of claim 12, wherein a rising edge of the dummy clock signal is disposed between a falling edge of the clock signal applied to an (i−1)th output buffer and a falling edge of the clock signal applied to the last output buffer.

15. The display device of claim 14, wherein a falling edge of the dummy clock signal is disposed before the voltage of the Q node is discharged.

16. The display device of claim 11, wherein the dummy output buffer comprises a transistor configured to receive any one clock signal among the plurality of clock signals and output the clock signal to the dummy line in response to the voltage of the Q node.

17. The display device of claim 16, wherein the plurality of clock signals have the same waveform and include k clock signals that are sequentially shifted in phase by 1/k periods, where k is a natural number of at least 2, and a (j−1)th clock signal is applied to a last output buffer among the plurality of output buffers, and a jth clock signal is applied to the dummy output buffer, where j is a natural number of at least 2.

18. The display device of claim 16, wherein the number of the plurality of clock signals has a relative prime relationship with the number of the output buffers that are connected to the shift register.

* * * * *